(12) United States Patent
Kaidu et al.

(10) Patent No.: US 10,609,838 B2
(45) Date of Patent: Mar. 31, 2020

(54) MOTOR DRIVING CONTROL DEVICE, MOTOR DRIVING SYSTEM, AND NON-TRANSITORY COMPUTER READABLE MEDIUM FOR MOTOR DRIVING CONTROL DEVICE

(71) Applicant: MINEBEA MITSUMI Inc., Nagano (JP)

(72) Inventors: Hiroyuki Kaidu, Kakegawa (JP); Masato Aoki, Iwata (JP)

(73) Assignee: MINEBEA MITSUMI INC., Nagano (JP)

( * ) Notice: Subject to any disclaimer, the term of this patent is extended or adjusted under 35 U.S.C. 154(b) by 0 days.

(21) Appl. No.: 16/168,988

(22) Filed: Oct. 24, 2018

(65) Prior Publication Data
US 2019/0166719 A1    May 30, 2019

(30) Foreign Application Priority Data
Nov. 29, 2017    (JP) ................................. 2017-229242

(51) Int. Cl.
*H02P 7/00*    (2016.01)
*H05K 7/20*    (2006.01)
*G06F 1/20*    (2006.01)
*G05B 15/02*   (2006.01)

(52) U.S. Cl.
CPC ......... *H05K 7/20209* (2013.01); *G05B 15/02* (2013.01); *G06F 1/20* (2013.01); *G06F 1/206* (2013.01); *H05K 7/20172* (2013.01); *H05K 7/20909* (2013.01)

(58) Field of Classification Search
CPC .. H05K 7/20209; H05K 7/20172; G06F 1/20; G05B 15/02

USPC ......................................................... 318/255
See application file for complete search history.

(56) References Cited

U.S. PATENT DOCUMENTS

| 2013/0175030 | A1* | 7/2013 | Ige ........................ | E21B 43/128 166/250.15 |
| 2015/0220070 | A1* | 8/2015 | Osada ................... | H02P 27/085 700/275 |
| 2015/0326153 | A1* | 11/2015 | Gohara .................... | H02P 7/29 318/400.2 |
| 2015/0355627 | A1* | 12/2015 | Hashimoto ........ | G05B 19/4063 700/114 |

(Continued)

FOREIGN PATENT DOCUMENTS

JP    2001-286187 A    10/2001

*Primary Examiner* — Eduardo Colon Santana
*Assistant Examiner* — Gabriel Agared
(74) *Attorney, Agent, or Firm* — Pearne & Gordon LLP

(57) ABSTRACT

A motor driving control device, together with a controller, included in a motor driving system, has a control circuit controlling drive of a motor according to instruction information transmitted from the controller. The control circuit has a first acquisition unit acquiring setting reference information related to assignment of identification information for the motor driving control device itself, the setting reference information being input from outside, a setting unit setting the motor driving control device's identification information based on a magnitude of a setting voltage input from the outside and the setting reference information, and a second acquisition unit acquiring the instruction information based on the identification information set by the setting unit.

12 Claims, 12 Drawing Sheets

(56) References Cited

U.S. PATENT DOCUMENTS

2016/0126870 A1* 5/2016 Katayama ................. H02P 6/08
318/723
2016/0259319 A1* 9/2016 Haga .................... G05B 19/402

* cited by examiner

| | |
|---|---|
| CONNECTION NUMBER (NUMBER INFORMATION) | 4 |
| RATED VOLTAGE | 12[V] |
| MINIMUM VOLTAGE Vmin | Vmin = 1 [V] (INDEPENDENT OF POWER SUPPLY VOLTAGE) |
| MAXIMUM VOLTAGE Vmax | Vmax = 4 [V] (INDEPENDENT OF POWER SUPPLY VOLTAGE) |
| VOLTAGE RESOLUTION Vr | Vr = (Vmax - Vmin) / (CONNECTION NUMBER - 1) = 1 [V] |

FIG.5

| REFERENCE VOLTAGE | CALCULATION METHOD FOR REFERENCE VOLTAGE | CALCULATION METHOD FOR VOLTAGE RANGE | EXAMPLE OF VOLTAGE RANGE (RATED VOLTAGE 12 V, POWER SUPPLY VOLTAGE 12 V) | EXAMPLE OF VOLTAGE RANGE (RATED VOLTAGE 12 V, POWER SUPPLY VOLTAGE 6 V) | ID |
|---|---|---|---|---|---|
| 1 | Vmin | REFERENCE VOLTAGE±Vr/2 | 1±0.5 | 0.5±0.25 | 1 |
| 2 | REFERENCE VOLTAGE OF ID1 + Vr | REFERENCE VOLTAGE±Vr/2 | 2±0.5 | 1±0.25 | 2 |
| 3 | REFERENCE VOLTAGE OF ID2 + Vr | REFERENCE VOLTAGE±Vr/2 | 3±0.5 | 1.5±0.25 | 3 |
| 4 | Vmax | FROM REFERENCE VOLTAGE-Vr/2 TO MEASURABLE MAXIMUM VALUE | 4±0.5 | 2±0.25 | 4 |

FIG.6

| CONNECTION NUMBER (NUMBER INFORMATION) | 8 |
|---|---|
| RATED VOLTAGE | 12[V] |
| MINIMUM VOLTAGE Vmin | Vmin = 1 [V] (INDEPENDENT OF POWER SUPPLY VOLTAGE) |
| MAXIMUM VOLTAGE Vmax | Vmax = 4 [V] (INDEPENDENT OF POWER SUPPLY VOLTAGE) |
| VOLTAGE RESOLUTION Vr | Vr = (Vmax - Vmin) / (CONNECTION NUMBER - 1) = 0.428571 [V] |

FIG.7

| REFERENCE VOLTAGE | CALCULATION METHOD FOR REFERENCE VOLTAGE | CALCULATION METHOD FOR VOLTAGE RANGE | EXAMPLE OF VOLTAGE RANGE (RATED VOLTAGE 12 V, POWER SUPPLY VOLTAGE 12 V) | EXAMPLE OF VOLTAGE RANGE (RATED VOLTAGE 12 V, POWER SUPPLY VOLTAGE 6 V) | ID |
|---|---|---|---|---|---|
| 1 | Vmin | REFERENCE VOLTAGE±Vr/2 | 1±0.214 | 0.5±0.107 | 1 |
| 1.428 | REFERENCE VOLTAGE OF ID1 + Vr | REFERENCE VOLTAGE±Vr/2 | 1.428±0.214 | 0.714±0.107 | 2 |
| 1.857 | REFERENCE VOLTAGE OF ID2 + Vr | REFERENCE VOLTAGE±Vr/2 | 1.857±0.214 | 0.929±0.107 | 3 |
| 2.285 | REFERENCE VOLTAGE OF ID3 + Vr | REFERENCE VOLTAGE±Vr/2 | 2.285±0.214 | 1.143±0.107 | 4 |
| 2.714 | REFERENCE VOLTAGE OF ID4 + Vr | REFERENCE VOLTAGE±Vr/2 | 2.714±0.214 | 1.357±0.107 | 5 |
| 3.142 | REFERENCE VOLTAGE OF ID5+ Vr | REFERENCE VOLTAGE±Vr/2 | 3.142±0.214 | 1.571±0.107 | 6 |
| 3.571 | REFERENCE VOLTAGE OF ID6 + Vr | REFERENCE VOLTAGE±Vr/2 | 3.571±0.214 | 1.786±0.107 | 7 |
| 4 | Vmax | FROM REFERENCE VOLTAGE-Vr/2 TO MEASURABLE MAXIMUM VALUE | 4±0.214 | 2±0.107 | 8 |

FIG.8

| CONNECTION NUMBER (NUMBER INFORMATION) | 4 |
|---|---|
| RATED VOLTAGE | 12[V] |
| MINIMUM VOLTAGE Vmin | Vmin = 1 [V] (INDEPENDENT OF POWER SUPPLY VOLTAGE) |
| MAXIMUM VOLTAGE Vmax | Vmax = 3 [V] (INDEPENDENT OF POWER SUPPLY VOLTAGE) |
| VOLTAGE RESOLUTION Vr | Vr = (Vmax - Vmin) / (CONNECTION NUMBER - 1) = 0.666... [V] |

FIG.9

MOTOR DRIVING CONTROL DEVICE, MOTOR DRIVING SYSTEM, AND NON-TRANSITORY COMPUTER READABLE MEDIUM FOR MOTOR DRIVING CONTROL DEVICE

CROSS REFERENCE TO RELATED APPLICATIONS

This application claims the benefit of Japanese Patent Application No. 2017-229242, filed Nov. 29, 2017, which is hereby incorporated by reference in its entirety.

BACKGROUND

Technical Field

The present disclosure relates to a motor driving control device, a motor driving system, a control method for the motor driving control device, and a control program of the motor driving control device, and, more particularly, to a motor driving control device controlling the driving of a motor based on the motor driving control device's identification information, the identification information being obtained from the outside, a motor driving system, a control method for the motor driving control device, and a control program of the motor driving control device.

Background

In a motor driving system, a plurality of motor driving control devices are controlled by one controller to drive motors connected to the respective motor driving control devices. Such a motor driving system is used for an electronic computer or the like, for example, and a plurality of fan motors arranged at the respective portions in the electronic computer are driven by one controller to cool the electronic computer.

In such a motor driving system, the different operations in each motor driving control device are performed under the control by the controller using the ID information (identification information such as an identification code) written to each of the motor driving control devices. For example, the instruction related to the rotational speed or the like can be executed by a specific motor driving control device by including the ID information of the motor driving control device to be instructed in the instruction information output from the controller. When receiving the instruction information including the ID information of the motor driving control device itself (self-device), the motor driving control device controls the driving of the motor based on the instruction information.

It is assumed that in a motor driving system, a plurality of fan motors for blowing air to different objects to be cooled, respectively are controlled by one controller, such that, for example, a first fan motor cools an object A to be cooled, and a second fan motor cools an object B to be cooled. In this type of motor driving system, there is a need to perform different controls for each of the fan motors, such that, for example, the first fan motor is rotated at 10,000 rpm, and the second fan motor is rotated at 4,000 rpm.

In such a case, for example, the ID information is written to each of the fans in advance, and the ID information is included in instruction information transmitted from the controller so that each of the fan motors can determine whether the instruction information has been addressed to the self-motor, thereby performing different controls for each of the fan motors.

Note that Japanese Patent Application Laid-Open No. 2001-286187 discloses a configuration of an electric equipment system comprising a plurality of fan motor control units configured to control the fan motors, and a system control unit configured to control the electric equipment system, wherein data communication is performed between the system control unit and the plurality of fan motor control units to control the plurality of fan motors.

SUMMARY

When a plurality of fan motors are used as described above, for example, it is necessary to set a motor driving system so that the ID information for each of the fan motors is different from other ID information. That is, when the motor driving system is manufactured, each of the plurality of fan motors having different ID information needs to be arranged or wired at an appropriate position in accordance with its own ID information, resulting in the difficulty level of the manufacturing operation being increased. When one of the plurality of fan motors needs to be replaced, it is necessary to prepare the fan motor so that the ID information after replacement coincides with the ID information before replacement, resulting in it becoming more difficult to maintain the motor driving system.

Japanese Patent Application Laid-Open No. 2001-286187 discloses that each fan motor controller reads an external signal and recognizes the corresponding identification information, but does not specifically disclose specific content of the external signal or a method of recognizing the identification information.

The present disclosure is related to providing a motor driving control device, a motor driving system, a control method for the motor driving control device, and a control program of the motor driving control device, capable of facilitating construction and maintenance of a motor driving system.

According to a first aspect of the present disclosure, a motor driving control device, together with a controller, included in a motor driving system comprises a control circuit controlling the drive of a motor according to instruction information transmitted from the controller, wherein the control circuit includes a first acquisition unit acquiring setting reference information related to assignment of identification information for the motor driving control device itself, the setting reference information being input from outside, a setting unit setting the motor driving control device's identification information based on a magnitude of a setting voltage input from the outside and the setting reference information, and a second acquisition unit acquiring the instruction information based on the identification information set by the setting unit.

Preferably, the instruction information includes information related to the drive of the motor, and designation information designating the motor driving control device that will be caused to execute a control operation based on the information related to the drive of the motor, and the control circuit controls the drive of the motor according to the instruction information when the designation information corresponding to the identification information set by the setting unit is included in the instruction information.

Preferably, the control circuit does not execute the control operation of the drive of the motor according to the instruction information when the designation information corresponding to the identification information set by the setting unit is not included in the instruction information.

Preferably, the control circuit outputs response information to the controller when the designation information corresponding to the identification information set by the setting unit is included in the instruction information.

Preferably, the setting unit sets, as the motor driving control device's identification information, information corresponding to a voltage range including a setting voltage out of a plurality of voltage ranges determined based on the setting reference information.

Preferably, the setting reference information includes number information indicating the number of motor driving control devices usable in the motor driving system.

Preferably, the setting reference information includes information related to a rated voltage of the motor driving system.

According to a second aspect of the present disclosure, a motor driving system comprises a first motor driving control device according to any one of the motor driving control devices described above of a first motor, a second motor driving control device according to any one of the motor driving control devices described above of a second motor, a controller connected to the first motor driving control device and the second motor driving control device, a first voltage output unit outputting a first setting voltage to the first motor driving control device, and a second voltage output unit outputting a second setting voltage to the second motor driving control device, the second setting voltage being different in magnitude from the first setting voltage, wherein the controller outputs instruction information to the first motor driving control device and the second motor driving control device, and outputs setting reference information to the first motor driving control device and the second motor driving control device.

Preferably, the first voltage output unit and the second voltage output unit are voltage dividing circuits dividing a voltage of a predetermined voltage source at respective voltage dividing ratios different from each other.

Preferably, the voltage of the predetermined voltage source is a power supply voltage supplied to the first motor driving control device and the second motor driving control device, and each of the first setting voltage and the second setting voltage is a constant voltage.

Preferably, the first voltage output unit and the second voltage output unit are provided in the controller.

According to a third aspect of the present disclosure, a control method for a motor driving control device, together with a controller included in a motor driving system, the motor driving control device controlling the drive of a motor according to instruction information corresponding to the motor driving control device itself, the instruction information being transmitted from the controller, comprises a first acquisition step of acquiring setting reference information related to assignment of identification information for the motor driving control device itself, the setting reference information being input from outside, a setting step of setting the motor driving control device's identification information based on a magnitude of a setting voltage input from the outside and the setting reference information, and a second acquisition step of acquiring the instruction information based on the identification information set by the setting step.

According to a fourth aspect of the present disclosure, a non-transitory computer readable medium stores therein a control program of a motor driving control device. The motor driving control device is, together with a controller, included in a motor driving system. The motor driving control device controls the drive of a motor according to instruction information corresponding to the motor driving control device itself, the instruction information being transmitted from the controller. The control program causes a computer to execute a first acquisition step of acquiring setting reference information related to identification information assignment for the motor driving control device itself, the setting reference information being input from outside, a setting step of setting the motor driving control device's identification information based on a magnitude of a setting voltage input from the outside and the setting reference information, and a second acquisition step of acquiring the instruction information based on the identification information set by the setting step.

These disclosures can provide a motor driving control device, a motor driving system, a control method for the motor driving control device, and a control program of the motor driving control device capable of facilitating construction and maintenance of a motor driving system.

BRIEF DESCRIPTION OF THE DRAWINGS

FIG. 5 is a table showing a first example of a relationship between setting reference information and a voltage resolution.

FIG. 6 is a table showing a relationship between identification information and a voltage range in the first example.

FIG. 7 is a table showing a second example of a relationship between the setting reference information and the voltage resolution Vr.

FIG. 8 is a table showing a relationship between the identification information and the voltage range in the second example.

FIG. 9 is a table showing a third example of a relationship between the setting reference information and the voltage resolution.

DETAILED DESCRIPTION

Hereinafter, a configuration of a motor driving system in embodiments of the present disclosure will be described.

Embodiments

Figure 1:
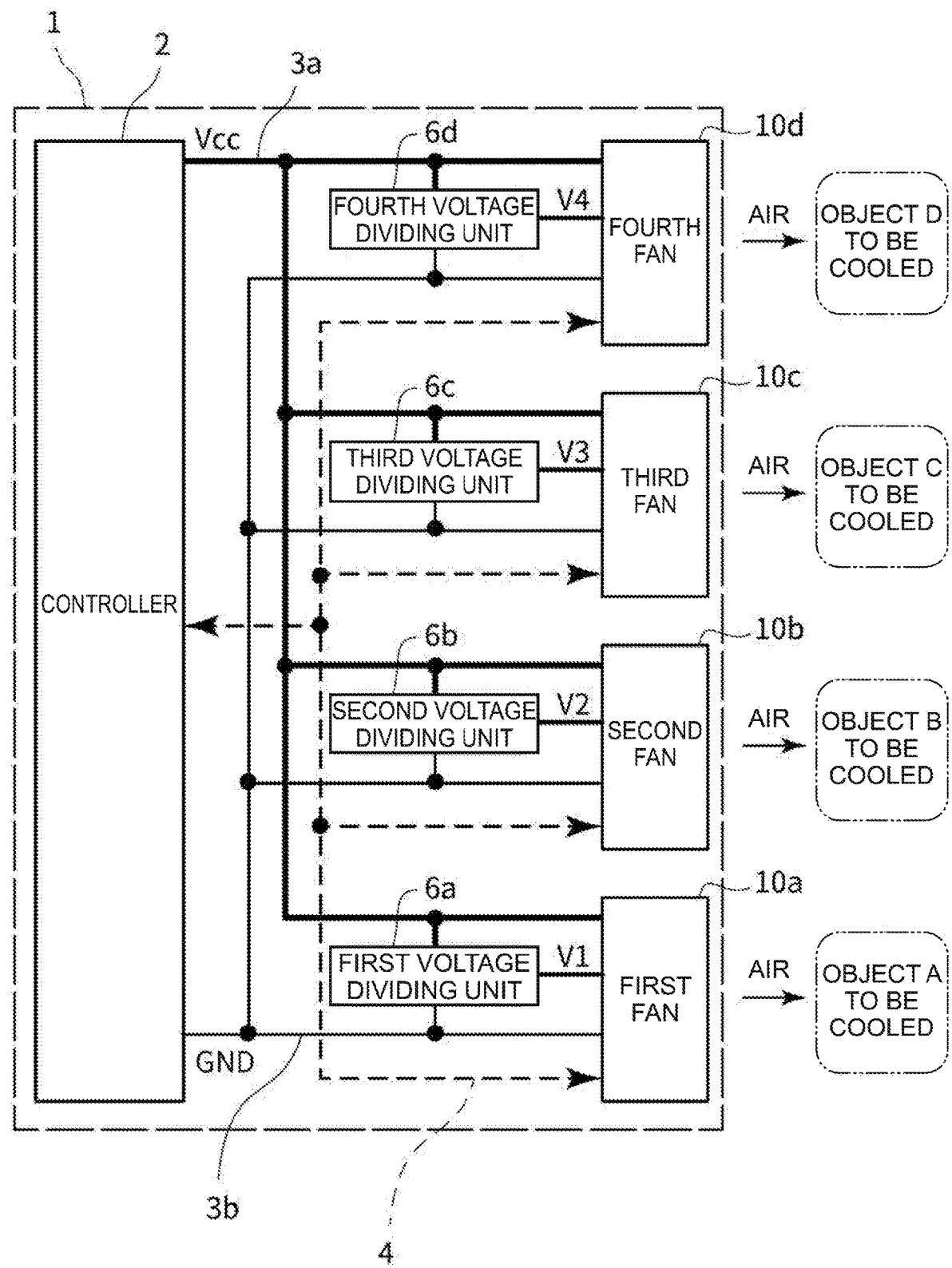
FIG. 1 is a diagram illustrating a configuration of a motor driving system in one of the embodiments of the present disclosure.

FIG. 1 is a diagram illustrating a configuration of a motor driving system 1 in one of embodiments of the present disclosure.

The motor driving system 1 is configured such that one controller controls the operations of a plurality of fan motors 10 for blowing air to a plurality of objects to be cooled, respectively. The fan motors 10 each include a motor 20 (illustrated in FIG. 2), and a motor driving control device 50 (illustrated in FIG. 2) controlling driving of the motor 20.

As will be explained below, the motor driving system 1 includes at least a first fan 10a including a first motor 20a (not illustrated) and a first motor driving control device 50a (not illustrated) controlling driving of the first motor 20a, a second fan 10b including a second motor 20b (not illustrated) and a second motor driving control device 50b (not illustrated) controlling driving of the second motor 20b, a controller 2 connected to the first motor driving control device 50a and the second motor driving control device 50b, a first voltage dividing unit (an example of a first voltage output unit) 6a for outputting a first setting voltage V1 to the first motor driving control device 50a, and a second voltage dividing unit (an example of a second voltage output unit) 6b for outputting a second setting voltage V2 to the second motor driving control device 50b, the second setting voltage V2 being different in magnitude from the first setting voltage V1. Each of the first voltage dividing unit 6a and the second voltage dividing unit 6b is a voltage dividing circuit for dividing a voltage of a predetermined voltage source at a voltage dividing ratio different from each other. In the present embodiment, the voltage of the predetermined voltage source is a power supply voltage Vcc supplied to the plurality of fan motors 10, i.e., a plurality of motor driving control devices 50 (collective reference numeral).

The controller 2 outputs instruction information to the first motor driving control device 50a and the second motor driving control device 50b as described later. The controller 2 outputs setting reference information to the first motor driving control device 50a and the second motor driving control device 50b. Although details will be described later, the setting reference information is information related to assignment of identification information.

As illustrated in FIG. 1, in the present embodiment, the motor driving system 1 includes one controller 2, and four fan motors 10 (a first fan 10a, a second fan 10b, a third fan 10c, and a fourth fan 10d). The first fan 10a is a fan motor for blowing air to an object A to be cooled. The second fan 10b is a fan motor for blowing air to an object B to be cooled. The third fan 10c is a fan motor for blowing air to an object C to be cooled. The fourth fan 10d is a fan motor for blowing air to an object D to be cooled. Note that the motor driving system 1 may be configured such that two, three or four fan motors 10 blow air to the same object to be cooled.

In the motor driving system 1, the controller 2 is connected to each of the fan motors 10 through a high-voltage side power supply line 3a and a low-voltage side power supply line 3b serving as a ground (ground voltage; reference voltage). Each of the fan motors 10 is adapted to be operable by the power supply voltage Vcc to be applied through the high-voltage side power supply line 3a and the low-voltage side power supply line 3b.

The controller 2 is connected to each of the fan motors 10 through a communication line 4. The communication line 4 allows communication between the controller 2 and each of the fan motors 10. In the present embodiment, the motor driving system 1 is configured to allow bidirectional serial communication between the controller 2 and each of the fan motors 10, but the communication system between the controller 2 and the fan motors 10 is not limited to the bidirectional serial communication, and may be unidirectional communication from the controller 2 to the fan motors 10.

In the present embodiment, the motor driving system 1 includes a plurality of voltage dividing units (an example of a first voltage output unit, an example of a second voltage output unit) 6. In the present embodiment, the motor driving system 1 is provided with four voltage dividing units 6 (a first voltage dividing unit 6a, a second voltage dividing unit 6b, a third voltage dividing unit 6c, and a fourth voltage dividing unit 6d).

Each of the plurality of voltage dividing units 6 is a voltage dividing circuit for dividing a voltage of a predetermined voltage source at a voltage dividing ratio different from one another. In the present embodiment, each of the voltage dividing units 6 is arranged between the high-voltage side power supply line 3a and the low-voltage side power supply line 3b to divide the power supply voltage Vcc at a voltage dividing ratio that differs depending on each of the voltage dividing circuits. A voltage divided by each voltage dividing unit 6 is input, as a setting voltage Vid, to the fan motor 10 corresponding to the voltage dividing units 6.

In the present embodiment, the four voltage dividing units 6 are provided to be associated with the four fan motors 10, respectively. More specifically, the first voltage dividing unit 6a is provided to be associated with the first fan 10a. A setting voltage V1 obtained from the first voltage dividing unit 6a is input to the first fan 10a. The second voltage dividing unit 6b is provided to be associated with the second fan 10b. A setting voltage V2 obtained from the second voltage dividing unit 6b is input to the second fan 10b. The third voltage dividing unit 6c is provided to be associated with the third fan 10c. A setting voltage V3 obtained from the third voltage dividing unit 6c is input to the third fan 10c. The fourth voltage dividing unit 6d is provided to be associated with the fourth fan 10d. A setting voltage V4 obtained from the fourth voltage dividing unit 6d is input to the fourth fan 10d.

Since the setting voltage Vid (setting voltages V1, V2, V3, and V4 divided by the four voltage dividing units 6, respectively) is a voltage obtained by dividing the power supply voltage Vcc by each voltage dividing unit 6 at the voltage dividing ratio of the voltage dividing unit 6, the setting voltage Vid becomes a constant voltage. Since the respective voltage dividing units 6 have different voltage dividing ratios, the setting voltages V1, V2, V3, V4 are voltages different in magnitude from one another.

Figure 2:
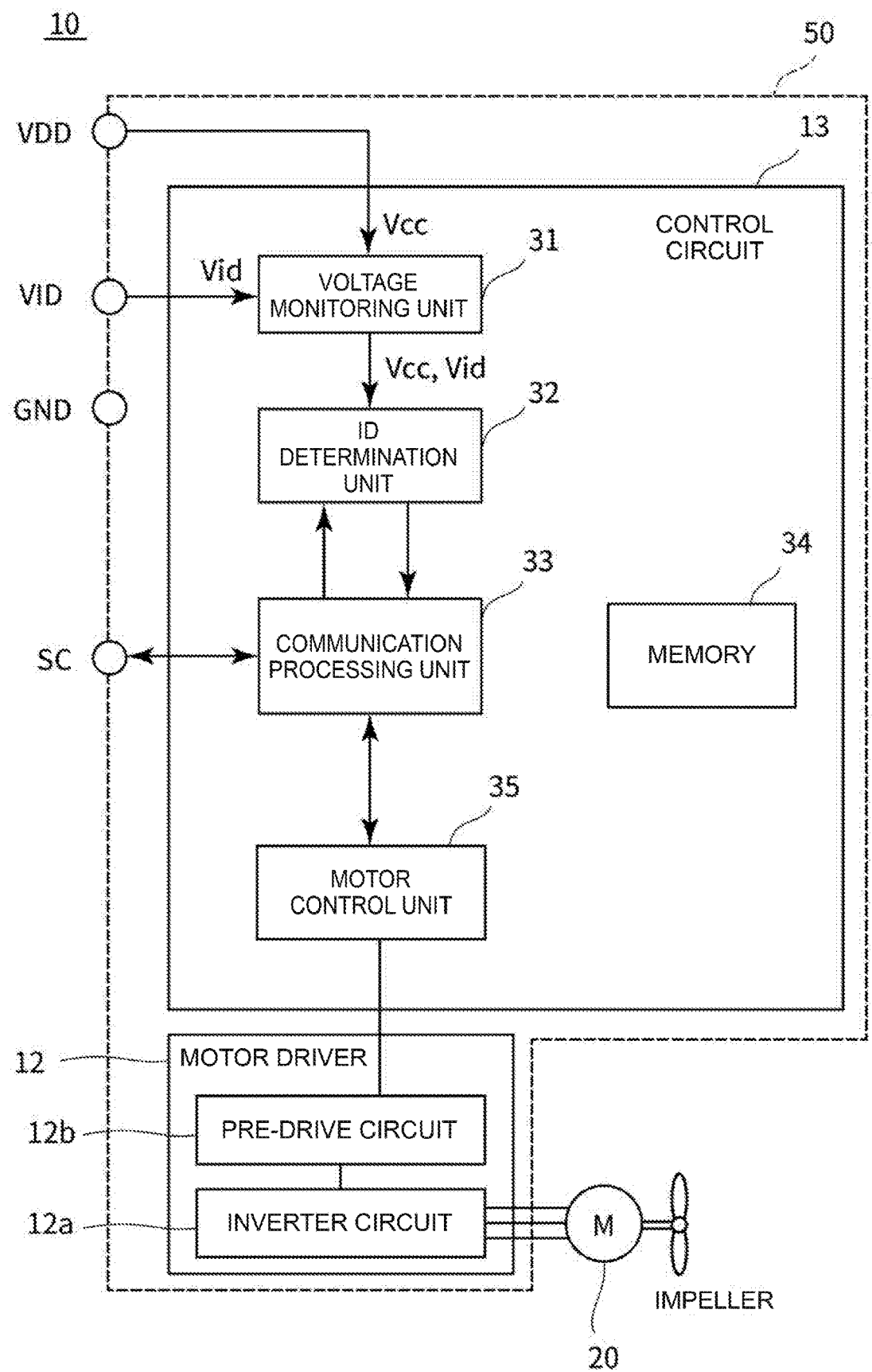
FIG. 2 is a diagram illustrating a configuration of respective fan motors used in the motor driving system.

FIG. 2 is a diagram illustrating a configuration of one of the fan motors 10 used in the motor driving system 1.

As illustrated in FIG. 2, the fan motor 10 includes the motor 20 for rotating an impeller, and the motor driving control device 50 controlling driving of the motor 20. The motor driving control device 50, together with the controller 2 is included in the motor driving system 1, and controls the driving of the motor 20 according to the instruction information transmitted from the controller 2.

Specifically, the motor driving control device 50 outputs a driving signal to the motor 20 to control the driving of the motor 20. The motor driving control device 50 rotates the motor 20 by periodically supplying the driving current to an armature coil of the motor 20. In the present embodiment, the motor 20 is, for example, a three-phase brushless motor, but is not limited to the three-phase brushless motor. The motor driving control device 50 is used with, but is not limited to, a position detector (not illustrated), such as a Hall IC, for detecting a position of a rotor of the motor 20.

In the present embodiment, the motor driving control device 50 includes a motor driver 12, a control circuit 13, and a plurality of terminals. The plurality of terminals include, for example, a power supply terminal VDD connected to the high-voltage side power supply line 3*a* to apply the power supply voltage Vcc, a ground terminal GND connected to the low-voltage side power supply line 3*b*, a communication terminal SC, and a setting terminal VID for applying the setting voltage Vid. Note that components of the motor driving control device 50 illustrated in FIG. 2 are part of the whole, and the motor driving control device 50 may include not only the components illustrated in FIG. 2 but also other components.

The motor driver 12 includes an inverter circuit 12*a* and a pre-drive circuit 12*b*. The motor driver 12 outputs the driving signal to the motor 20 based on a drive control signal output from the control circuit 13 to drive the motor 20.

The pre-drive circuit 12*b* generates an output signal for driving the inverter circuit 12*a* based on the drive control signal output from the control circuit 13, and outputs the output signal to the inverter circuit 12*a*. The inverter circuit 12*a* outputs the driving signal to the motor 20 based on the output signal output from the pre-drive circuit 12*b*, and energizes three-phase armature coils of the motor 20. The inverter circuit 12*a* is configured such that, for example, pairs of two switching elements each forming a series circuit are provided at opposite terminals of a DC power supply, and are disposed for respective phases of the armature coils. In each pair of two switching elements, a connection point between the two switching elements is connected to a terminal of the corresponding phase of the motor 20. The pre-drive circuit 12*b* outputs, as the output signals, six types of signals corresponding to the respective switching elements in the inverter circuit 12*a*. When these output signals are output, the switching elements are turned on or off according to the respective output signals so that the driving signal is output to the motor 20 to supply the electric power to each phase of the motor 20.

The control circuit 13 is comprised of a microcomputer, a digital circuit, and the like, for example. The control circuit 13 is connected to the plurality of terminals (the power supply terminal VDD, the ground terminal GND, the setting terminal VID, and the communication terminal SC). The control circuit 13 includes a voltage monitoring unit 31, an ID determination unit (an example of a setting unit) 32, a communication processing unit (an example of a first acquisition unit and a second acquisition unit) 33, a memory 34, and a motor control unit 35. The control circuit 13 outputs the drive control signal to the motor driver 12 to control the operation of the motor driver 12 based on a position signal input from the position detector.

The voltage monitoring unit 31 monitors the power supply voltage Vcc input to the motor driving control device 50 through the power supply terminal VDD, and the setting voltage Vid input to the motor driving control device 50 through the setting terminal VID. The voltage monitoring unit 31 acquires power supply voltage information related to the magnitude of the power supply voltage Vcc, and outputs the information to the ID determination unit 32. The voltage monitoring unit 31 also acquires setting voltage information related to the magnitude of the setting voltage Vid, and outputs the information to the ID determination unit 32. Note that in the following explanation, the power supply voltage information used in the control circuit 13 may be referred to simply as the power supply voltage Vcc, and the setting voltage information used in the control circuit 13 may be referred to simply as the setting voltage Vid, for the sake of convenience.

The power supply voltage information (power supply voltage Vcc) and the setting voltage information (setting voltage Vid) output from the voltage monitoring unit 31 are input to the ID determination unit 32. As described later, the setting reference information received by the communication processing unit 33 is input to the ID determination unit 32. The ID determination unit 32 functions as a setting unit, and performs an address determination process as described later, and determines the identification information (may be referred to as ID information, or address) of the motor driving control device 50. The determined identification information is transmitted to the communication processing unit 33, and is stored in the communication processing unit 33 or the memory 34. As a result, the motor driving control device 50's identification information is set.

The communication processing unit 33 is connected to the communication terminal SC to perform a control operation related to the communication between the motor driving control device 50 and the controller 2. The communication terminal SC is connected to the communication line 4. The communication terminal SC is a terminal for receiving the instruction information transmitted from the controller 2 and the setting reference information transmitted from the controller 2. The communication terminal SC is also a terminal for outputting response information to the controller 2 from the motor driving control device 50. The communication processing unit 33 acquires, as a first acquisition unit, setting reference information related to assignment of the identification information for the self-device 50, the setting reference information being transmitted from the controller 2, and outputs the setting reference information to the ID determination unit 32. After the ID determination unit 32 sets the identification information of the device 50, when instruction information addressed to the self-device 50 is transmitted from the controller 2, the communication processing unit 33 acquires, as a second acquisition unit, the instruction information and outputs the instruction information to the motor control unit 35.

The instruction information includes information related to the driving of the motor 20, and designation information designating the motor driving control device 50 to be caused to execute the control operation based on the information related to the driving of the motor 20. The information related to the driving of the motor 20 is information such as rotational speed command information corresponding to the target rotational speed of the motor 20, the information being used for controlling the rotational speed of the motor 20. The information related to the driving of the motor 20 is also information for instructing the motor 20 to be driven or stopped. The designation information is, for example, information for specifying the motor driving control device 50's identification information to be caused to execute the control operation.

In the present embodiment, the communication processing unit 33 recognizes the identification information determined/set by the ID determination unit 32 as identification information of the individual motor driving control device 50 itself, and controls the communication with the controller 2. For example, as described later, when the instruction information (also referred to as the "instruction information addressed to the self-device 50) including the designation information designating the self-device 50 as a device to be caused to execute the control operation is output from the controller 2, the communication processing unit 33 acquires, as the second acquisition unit, the instruction information based on the identification information of the self-device 50 set by the ID determination unit 32, and transmits the information related to the driving of the motor 20 to the motor control unit 35.

The memory 34 is formed using a ROM (read-only memory), a RAM (random access memory), and the like, for example. The memory 34 stores self-diagnosis information generated by performing self-diagnosis of the operating state of the motor driving control device 50 using the control circuit 13, information related to the control operation of the motor 20, operating parameters (for example, advance angle value, etc.) preset and used for the control operation of the motor 20. The memory 34 may store the identification information determined by the ID determination unit 32, and the like. The memory 34 may store a control program to be executed by the control circuit 13, and the like.

The control circuit 13 can perform various operations based on the information stored in the memory 34. When the memory 34 stores an advance angle value as an operating parameter, for example, the motor control unit 35 can output the drive control signal based on the advance angle value. This makes it possible to control the timing of the energization of the coils of the motor 20.

The motor control unit 35 outputs the drive control signal to the motor driver 12 based on the instruction information addressed to the self-device 50 acquired by the communication processing unit 33, and the information related to a rotational position of the motor 20 (for example, a position signal acquired by the position detector, etc.), and the information stored in the memory 34. The drive control signal is a PWM signal having a duty ratio corresponding to a torque for rotating the motor 20, for example. For example, the motor control unit 35 outputs the drive control signal in which the duty ratio is adjusted so that the actual rotational speed of the motor 20 determined based on the position information coincides with the target rotational speed. The drive control signal is output at an appropriate timing corresponding to the rotational position of the motor 20 for each phase of the motor 20.

Note that in the present embodiment, the motor driving control device 50 is packaged as one integrated circuit. That is, the motor driver 12 and the control circuit 13 form one integrated circuit. The integrated circuit includes a plurality of terminals such as the power supply terminal VDD, the communication terminal SC, and the ground terminal GND. Note that for example, part of the motor driving control device 50 such as solely the control circuit 13 may be packaged as one integrated circuit. The whole or part of the motor driving control device 50 may be packaged as one integrated circuit together with the other devices.

Figure 3:
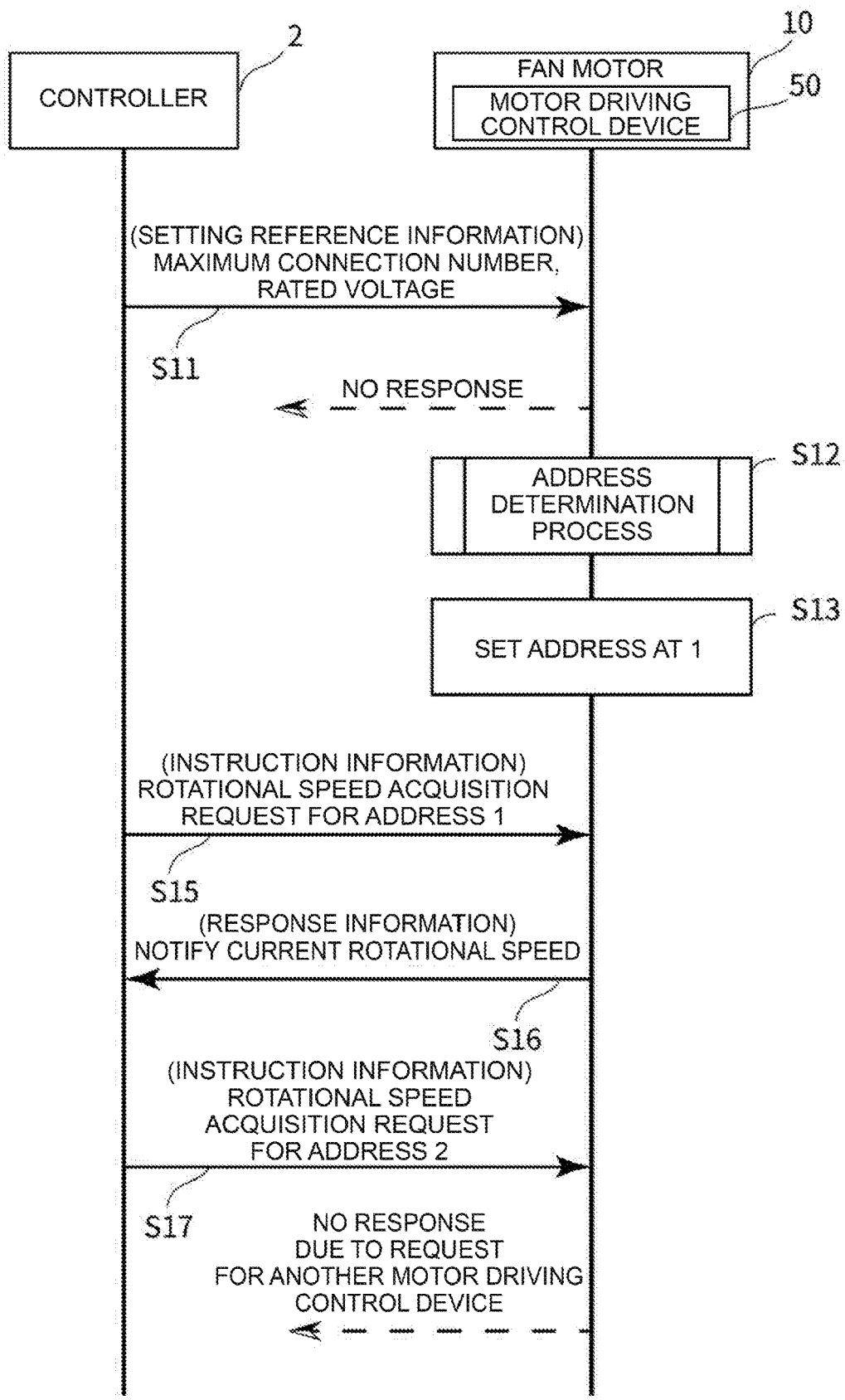
FIG. 3 is a diagram for explaining an example of a communication sequence between a controller and a motor driving control device.

FIG. 3 is a diagram for explaining an example of a communication sequence between the controller 2 and the motor driving control device 50.

In the present embodiment, the control circuit 13 of the motor driving control device 50 acquires setting reference information related to assignment of the identification information for the self-device 50, the setting reference information being input from the outside of the motor driving control device, and sets the setting voltage information related to the magnitude of the setting voltage Vid input from the outside and the identification information of the individual motor driving control device 50 itself based on the setting reference information. Then, the control circuit 13 acquires the instruction information based on the identification information set for the self-device 50.

When the instruction information transmitted from the controller 2 includes the designation information corresponding to the identification information set for the motor driving control device 50 itself, the control circuit 13 controls the driving of the motor 20 according to the instruction information. When the instruction information transmitted from the controller 2 includes the designation information corresponding to the set identification information, the control circuit 13 outputs response information to the controller 2 from the communication processing unit 33. On the other hand, when the instruction information transmitted from the controller 2 does not include the designation information corresponding to the identification information set for the motor driving control device 50 itself, the control circuit 13 does not execute the control operation of the driving of the motor 20 according to the instruction information.

In the present embodiment, the setting reference information includes number information indicating the number of motor driving control devices 50 usable in the motor driving system 1. More specifically, in the present embodiment, the number information indicates the maximum number of fan motors 10 (the maximum connection number) capable of being connected to the controller 2 and used at the same time.

In the present embodiment, the setting reference information includes information related to a rated voltage of the motor driving system 1 (hereinafter simply referred to as a rated voltage). When the rated voltage is 12 volts, for example, information to that effect is included in the setting reference information. Note that the rated voltage is not limited to 12 volts, and may be another value.

In the motor driving system 1, when the power supply is turned on, for example, the operation for setting the identification information of the individual motor driving control device 50 itself is performed between the controller 2 and the individual motor driving control devices 50. When the identification information of the individual motor driving control device 50 itself is set, the individual motor driving control device 50 controls the driving of the motor 20 based on the instruction information output from the controller 2.

Specifically, as illustrated in FIG. 3, in step S11, the controller 2 outputs the setting reference information to the individual motor driving control device 50. The setting reference information includes the number information (the maximum connection number) and the information on the rated voltage.

When the setting reference information is thus output from the controller 2, the communication processing unit 33 in the motor driving control device 50 functions as a first acquisition unit, and receives (acquires) the setting reference information. At this time, the communication processing unit 33 does not output information to the controller 2 (or does not respond to the setting reference information).

In step S12, the ID determination unit 32 performs the address determination process.

In step S13, the ID determination unit 32 functions as a setting unit, and sets an address (identification information) determined in the address determination process as identification information of the self-device 50. In the following description, the address is set at "1."

In step S15, it is assumed that the instruction information for the address "1" is transmitted. Here, it is assumed that a rotational speed acquisition request is transmitted as the instruction information. Such instruction information includes the address "1" as the designation information, and the rotational speed acquisition request as the information related to the control of the motor 20.

When such instruction information addressed to the self-device 50 including the designation information corresponding to the identification information of the self-device 50 is transmitted, the communication processing unit 33 acquires the instruction information as information addressed to the self-device 50, and performs a process according to the instruction information.

That is, in step S16, the motor driving control device 50 transmits the response information to the controller 2. Here, in response to acquiring the instruction information including the rotational speed acquisition request, the communication processing unit 33 transmits the current rotational speed of the motor 20 as the response information. Note that as the response information, simple information to the effect that the communication processing unit 33 has acquired the instruction information, that the control operation of the motor 20 has been executed based on the instruction information, or the like may be transmitted. The response information may include the motor driving control device 50's identification information, thereby enabling the controller 2 to determine which of the motor driving control devices 50 has transmitted the response information.

On the other hand, in step S17, it is assumed that the instruction information for the address "2" is transmitted. Here, it is assumed that a rotational speed acquisition request is transmitted as the instruction information.

When such instruction information including the designation information not corresponding to the identification information of the self-device 50 (instruction information addressed to another motor driving control device 50) is transmitted, the communication processing unit 33 does not acquire the instruction information. Therefore, the motor driving control device 50 with its address set to "1" does not perform the operation according to this instruction information.

Note that, in this case, if another motor driving control device 50 with its address set to "2" exists in the motor driving system 1, this motor driving control device 50 acquires the instruction information, and performs the operation according to the instruction information.

Figure 4:
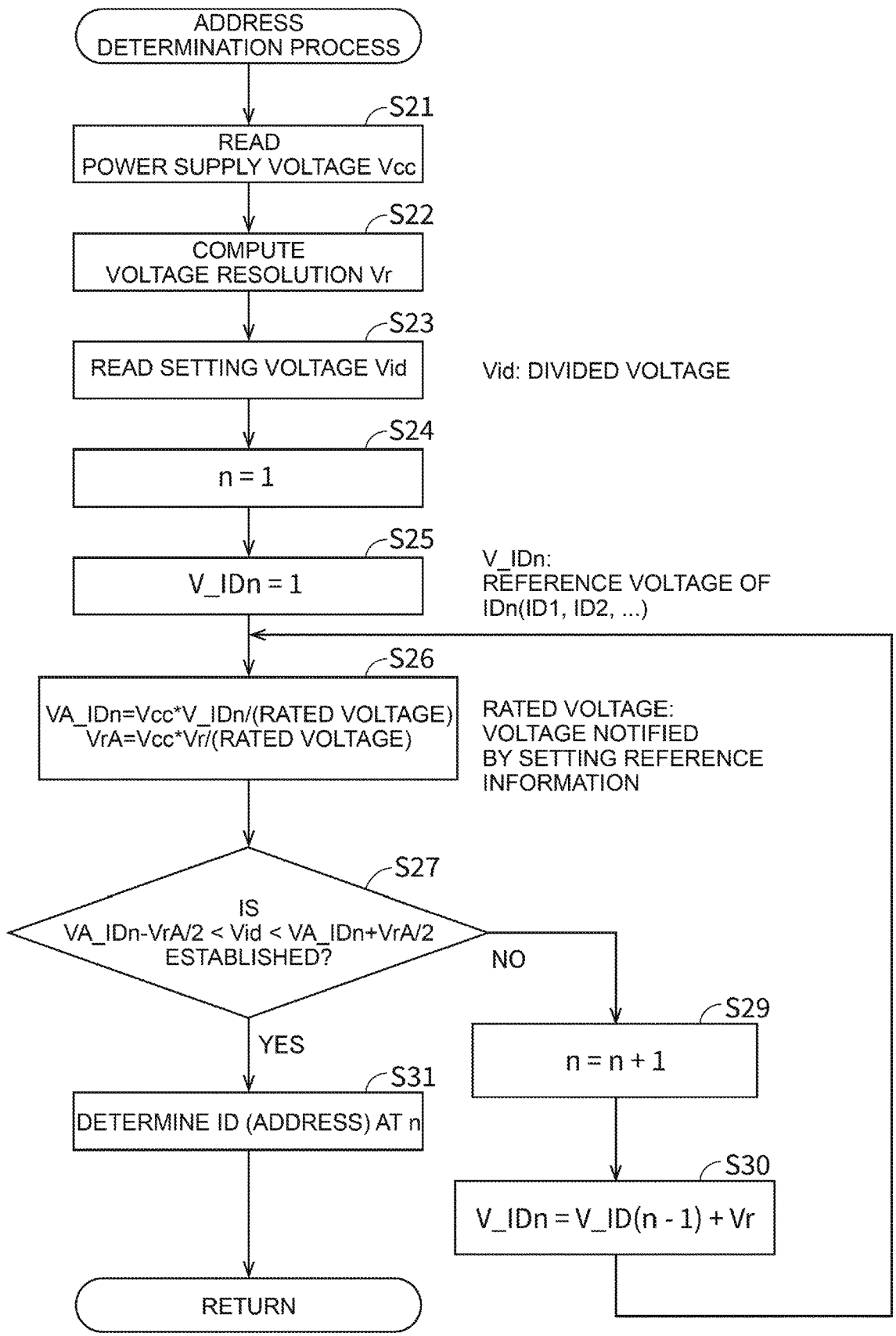
FIG. 4 is a flowchart illustrating an address determination process.

FIG. 4 is a flowchart illustrating the address determination process.

In the present embodiment, the identification information of the individual motor driving control device 50 itself is determined as follows. The ID determination unit 32 determines, as the motor driving control device 50's identification information, information corresponding to a voltage range including the setting voltage Vid out of a plurality of voltage ranges determined based on the setting reference information acquired by the communication processing unit 33.

As illustrated in FIG. 4, in step S21, the ID determination unit 32 reads the power supply voltage information. That is, the ID determination unit 32 reads the power supply voltage Vcc based on monitoring results of the voltage monitoring unit 31.

In step S22, the ID determination unit 32 computes a voltage resolution Vr. The voltage resolution Vr is computed based on the power supply voltage Vcc, and the setting reference information acquired by the communication processing unit 33 functioning as the first acquisition unit. That is, the voltage resolution Vr is computed based on the power supply voltage Vcc, the rated voltage (a reference value of the power supply voltage Vcc), and the number information.

In step S23, the ID determination unit 32 reads the setting voltage information acquired by the voltage monitoring unit 31. That is, the ID determination unit 32 reads the setting voltage Vid (i.e., a voltage divided by the voltage dividing unit 6) input to the motor driving control device 50 based on the monitoring results of the voltage monitoring unit 31.

In step S24 and thereafter, the ID determination unit 32 specifies the voltage range including the setting voltage Vid out of the plurality of voltage ranges determined based on the voltage resolution Vr, and determines the address corresponding to the specified voltage range as the identification information of the individual motor driving control device 50 itself.

FIG. 5 is a table showing a first example of a relationship between the setting reference information and the voltage resolution Vr. FIG. 6 is a table showing a relationship between the identification information and the voltage range in the first example.

FIG. 5 shows the connection number (the number information), the rated voltage of the motor driving system 1, the minimum reference voltage Vmin in the voltage range (the minimum voltage Vmin), the maximum reference voltage Vmax in the voltage range (the maximum voltage Vmax), and the voltage resolution Vr. Here, the information indicating that the connection number is 4, and the rated voltage is 12 volts is included in the setting reference information to be transmitted from the controller 2. The minimum voltage Vmin and the maximum voltage Vmax are preset values. The minimum voltage Vmin and the maximum voltage Vmax may be stored in the memory 34 in advance, for example. The maximum voltage Vmax is set to be slightly lower than high voltage (e.g., 5 volts) of the control circuit 13.

The voltage resolution Vr is a value obtained by dividing a difference between the maximum voltage Vmax and the minimum voltage Vmin by a value obtained by subtracting 1 from the number information (the maximum connection number). Here, the number information is 4, and the difference between the maximum voltage Vmax and the minimum voltage Vmin is 3 volts, resulting in the voltage resolution Vr becoming 1.

As illustrated in FIG. 6, four voltage ranges (four is the number indicated in the number information) and the respective reference voltages are determined based on the maximum voltage Vmax, the minimum voltage Vmin, and the voltage resolution Vr. Here, the lowest voltage range corresponding to the address "1" to the highest voltage range corresponding to the address "4" are defined.

Each of the voltage ranges ranges from a voltage lower than the reference voltage by one-half of the voltage resolution Vr to a voltage higher than the reference voltage by one-half of the voltage resolution Vr. That is, a width of the voltage range is equal to the magnitude of the voltage resolution Vr. Note that the voltage range is not limited to the range thus centered about the reference voltage, and may be the voltage range including the reference voltage as the lower limit or the upper limit. Note that the lowest voltage range may be the range of 0 volts or more. The upper limit of the highest voltage range is not set, and may be set to the measurable maximum value.

In an example shown in FIG. 6, the voltage range corresponding to the address "1" is a range, centered about a reference voltage for the address "1" set at 1 volt of the minimum voltage Vmin, of plus or minus 0.5 volts. In other words, if the magnitude of the setting voltage Vid falls within this voltage range, the address is set at "1." Note that, in this example, the plus-side maximum value overlaps a voltage range for another address, and therefore the plus-side maximum value is not intended to be included in the voltage range.

Similarly, the voltage range corresponding to the address "2" is a range, centered about a reference voltage for the address "2" set at 2 volts, of plus or minus 0.5 volts, the reference voltage for the address "2" being higher than 1 volt of the reference voltage for the address "1" by the voltage resolution Vr. The voltage range corresponding to the address "3" is a range, centered about a reference voltage for the address "3" set at 3 volts, of plus or minus 0.5 volts, the reference voltage for the address "3" being higher than 2 volts of the reference voltage for the address "2" by the voltage resolution Vr. The voltage range corresponding to the address "4" is a range, centered about a reference voltage for the address "4" set at 4 volts, from a voltage lower than the reference voltage by 0.5 volts to the measurable maximum value, the reference voltage for the address "4" being the maximum voltage Vmax or a value higher than 3 volts of the reference voltage for the address "3" by the voltage resolution Vr.

Note that each of the above-described voltage ranges is a voltage range when the power supply voltage Vcc is 12 V with respect to the rated voltage of 12 V. When the power supply voltage Vcc varies with respect to the rated voltage of 12 V, resulting in the power supply voltage Vcc having a different value from 12 V, the voltage range varies according to the rate of the variability of the power supply voltage Vcc with respect to the rated voltage.

That is, each of the voltage ranges is set by multiplying by a value obtained by dividing the power supply voltage Vcc by the rated voltage. For example, it is assumed that the rated voltage is 12 V and the power supply voltage Vcc is 6 V. In this case, each of the voltage ranges is a range obtained by multiplying the voltage range in which the power supply voltage Vcc coincides with the rated voltage by 0.5 (FIG. 6 shows an example of the voltage range in this case).

Since the voltage range is thus determined according to the ratio of the power supply voltage Vcc to the rated voltage 12 V, even if the variation of the power supply voltage Vcc causes the variation of the setting voltage Vid obtained by dividing the power supply voltage Vcc, the determination of the identification information is not affected by the variation of the setting voltage Vid.

FIG. 7 is a table showing a second example of a relationship between the setting reference information and the voltage resolution Vr. FIG. 8 is a table showing a relationship between the identification information and the voltage range in the second example.

The second example shown in FIG. 7 and FIG. 8 is different from the first example in that the connection number (the number information) is 8. In this case, the voltage resolution Vr is 0.428 volts. Therefore, as shown in FIG. 8, the width of one voltage range is narrower, as compared to a case where the number information is 4. Note that in this example, the plus-side value overlaps a voltage range for another address, and therefore the plus-side value is not intended to be included in the voltage range.

FIG. 9 is a table showing a third example of a relationship between the setting reference information and the voltage resolution Vr.

FIG. 9 is different from the first example in that a value of the maximum voltage Vmax is 3 volts. For example, when a high voltage of the control circuit 13 is 3.3 volts, the value of the maximum voltage Vmax is set to be lower than the high voltage so that a plurality of voltage ranges can be provided within the high voltage. In this case, the difference between the maximum voltage Vmax and the minimum voltage Vmin is 2 volts, and the number information is 4, resulting in the voltage resolution Vr becoming 0.666 . . . volts.

As described above, since the plurality of voltage ranges are determined based on the voltage resolution Vr, in step S24 and thereafter in FIG. 4, the ID determination unit 32 specifies the voltage range including the setting voltage Vid out of the plurality of voltage ranges, and determines the address corresponding to the specified voltage range as the identification information of the individual motor driving control device 50 itself.

That is, in step S24, the ID determination unit 32 sets a variable n at 1. The variable n is the number of the voltage range corresponding to the address in the present embodiment.

In step S25, the ID determination unit 32 set the reference voltage V_IDn of the voltage range n at "1." Here, the reference voltage V_IDn is a reference voltage in the minimum voltage range, and is set at the minimum voltage Vmin in the present embodiment.

In step S26, the ID determination unit 32 performs a correction process of the reference V_IDn and the voltage resolution Vr according to the ratio of the power supply voltage Vcc to the rated voltage. The correction process is performed based on the rated voltage notified as the setting reference information and the power supply voltage Vcc. That is, the reference voltage after correction VA_IDn is calculated by multiplying the reference voltage V-IDn by a value obtained by dividing the power supply voltage Vcc by the rated voltage. The voltage resolution after correction VrA is calculated by multiplying the voltage resolution Vr by a value obtained by dividing the power supply voltage Vcc by the rated voltage.

In step S27, the ID determination unit 32 determines whether the setting voltage Vid falls within the voltage range. That is, the ID determination unit 32 determines whether the setting voltage Vid falls within a range from the voltage obtained by subtracting one-half of the voltage resolution after correction VrA from the reference voltage after correction VA_IDn to the voltage obtained by adding one-half of voltage resolution after correction VrA to the reference voltage after correction VA_IDn. If no, the process proceeds to step S29. If yes, the process proceeds to step S31.

In step S29, the ID determination unit 32 adds 1 to the variable n.

In step S30, the ID determination unit 32 determines the reference voltage V_IDn of the next voltage range n as a value obtained by adding the voltage resolution Vr to the reference voltage V_ID(n−1) of the previous voltage range.

Thereafter, returning to step S26, in step S27, the ID determination unit 32 determines whether the setting voltage Vid falls within the voltage range.

In step S31, the ID determination unit 32 determines the variable n (address "n") at that time as the motor driving control device 50's identification information. When the identification information is determined, the identification information is transmitted from the ID determination unit 32 to the communication processing unit 33, and then the identification information of the individual motor driving control device 50 itself is set (step S13 in FIG. 3).

As described above, in the present embodiment, the power supply voltage Vcc supplied from the controller 2 and the setting voltage Vid generated by dividing the power supply voltage Vcc are supplied to each of the fan motors 10, the setting voltage Vid having a value different for each fan motor 10. The controller 2 transmits the setting reference information to each fan motor 10 using the communication line 4 when the control is started. The motor driving control device 50 of each fan motor 10 can determine the identification information of the individual motor driving control device 50 itself by a calculation process based on the power supply voltage Vcc, the setting voltage Vid, and the setting reference information.

Thus, the identification information is automatically set based on the setting voltage Vid input to the motor driving control device 50 from the outside. Accordingly, setting the setting voltage Vid by adjusting the voltage dividing ratio of each voltage dividing unit 6 enables the identification information addressed to the self-device 50 not in conflict with another identification information to be automatically set for each motor driving control device 50 in a simple configuration. Since the identification information is not assigned for each fan motor 10 in advance, a plurality of fan motors 10 can be arranged in the motor driving system 1 without considering the relationship between the identification information and the arrangement position, and the construction and maintenance of the motor driving system 1 can be facilitated.

The voltage range corresponding to the identification information to be determined is corrected according to the ratio of the power supply voltage Vcc to the rated voltage. Accordingly, even if the power supply voltage Vcc varies due to the voltage reduction and the influence of noise, the identification information is appropriately determined.

In the present embodiment, the setting voltage Vid input to each fan motor 10 is generated by dividing the common power supply voltage Vcc at the voltage dividing ratio of the corresponding voltage dividing unit. Accordingly, the number of output terminals of the controller 2 can be reduced, and the manufacturing cost of the motor driving system 1 can be reduced.

[Description of Variant]

Note that each setting voltage Vid may be input to each motor driving control device as it is from a controller. For example, when a first motor driving control device and a second motor driving control device are included in a motor driving system, a first voltage output unit outputting a first setting voltage to the first motor driving control device and a second voltage output unit outputting a second setting voltage to the second motor driving control device may be provided inside the controller. In this case, the voltages obtained by dividing a voltage of a voltage source provided inside the controller by the first voltage output unit and the second voltage output unit at the respective voltage dividing ratios may be output as the first setting voltage and the second setting voltage, respectively.

Figure 10:
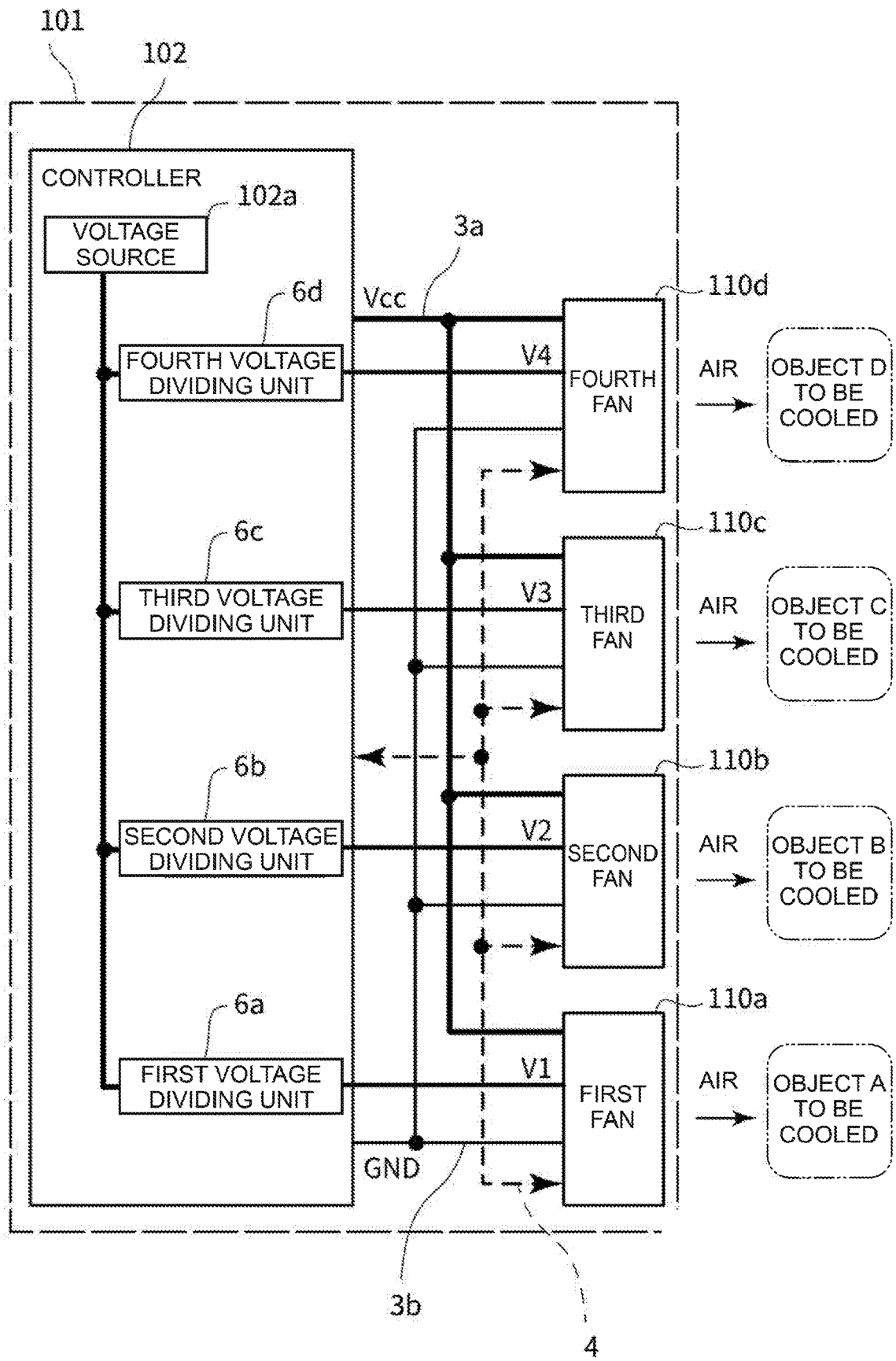
FIG. 10 is a diagram illustrating a configuration of a motor driving system in a variant of the present embodiment.
Figure 11:
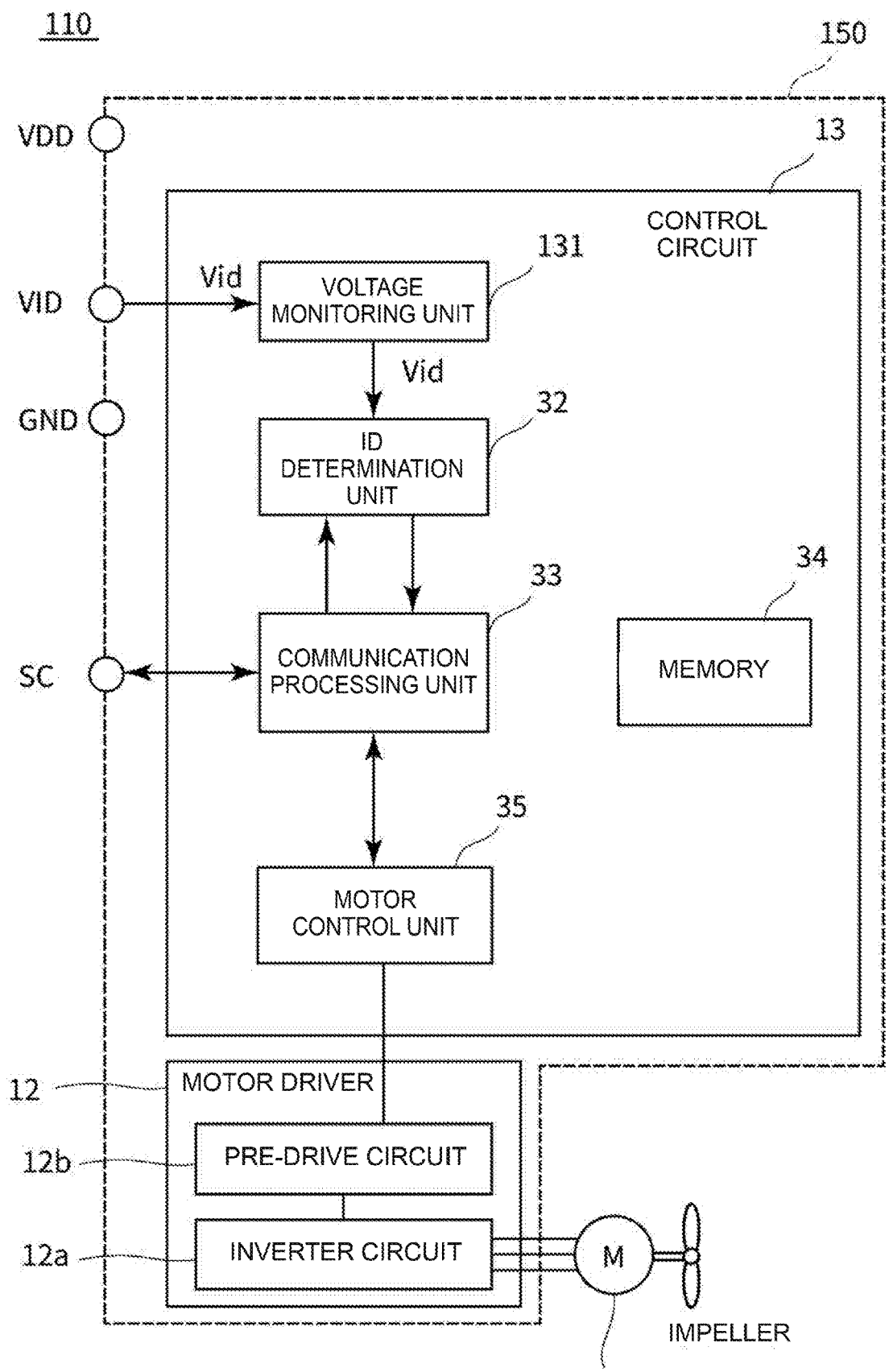
FIG. 11 is a diagram illustrating a configuration of respective fan motors in the variant of the present embodiment.

FIG. 10 is a diagram illustrating a configuration of a motor driving system 101 in a variant of the present embodiment. FIG. 11 is a diagram illustrating a configuration of one of fan motors 110 in the variant of the present embodiment.

Only different points from the above-described embodiment will be described with reference to FIG. 10 and FIG. 11.

In the present variant, the motor driving system 101 includes a controller 102, and the fan motors 110 (a first fan 110a to a fourth fan 110d) connected to the controller 102. The controller 102 includes a voltage source 102a, and four voltage dividing units 6 (a first voltage dividing unit 6a to a fourth voltage dividing unit 6d) corresponding to the respective fan motors 110. A voltage of the voltage source 102a is a constant voltage, and the voltage dividing units 6 divide the voltage of the voltage source 102a at different voltage dividing ratios, and output the divided voltages as setting voltages Vid (setting voltages V1 to V4) to the respective fan motors 110.

The motor driving control device 150 of each of the fan motors 110 is different from the motor driving control device in the above-described embodiment in that a voltage monitoring unit 131 monitors the setting voltage Vid, but does not monitor the power supply voltage Vcc.

Figure 12:
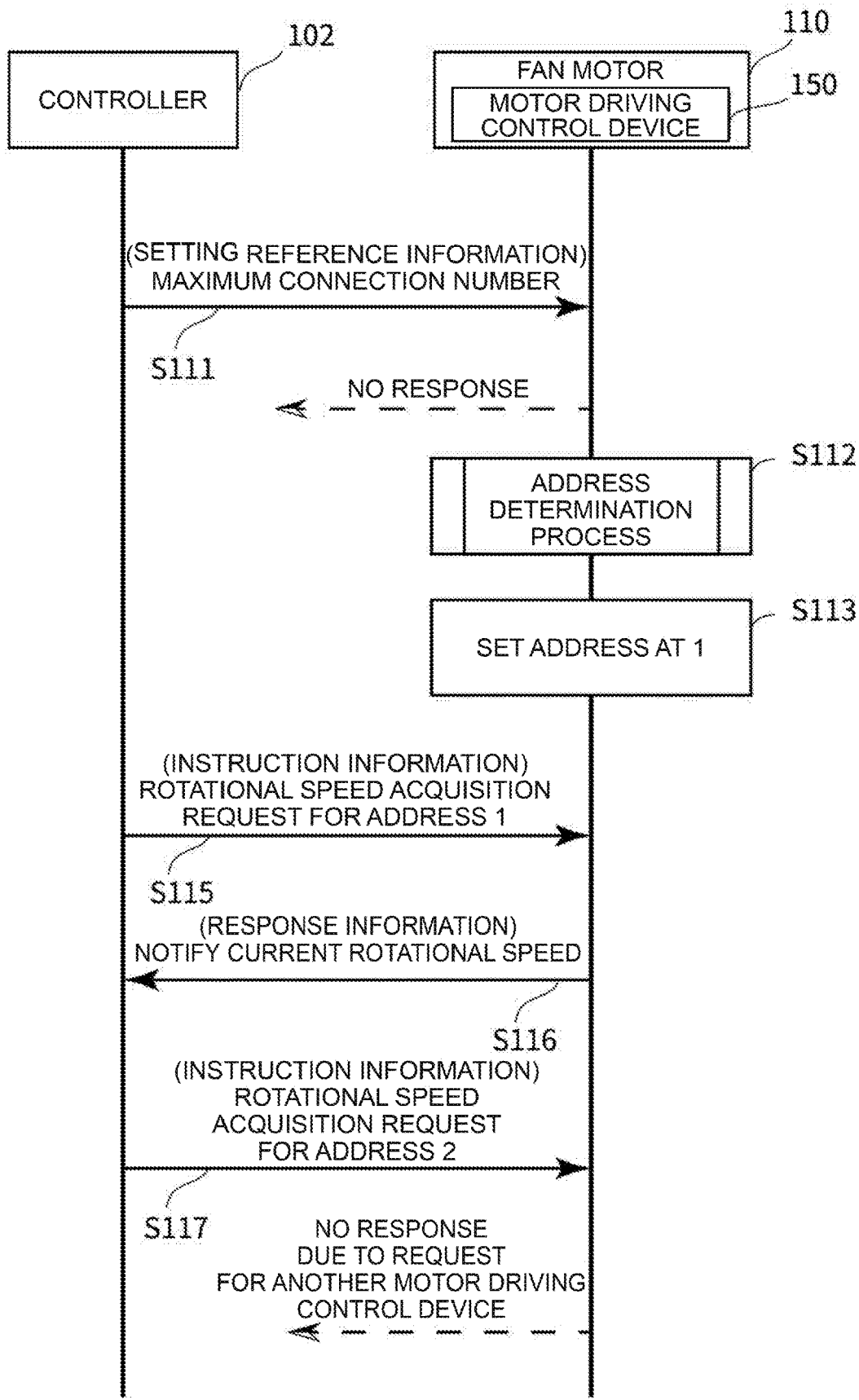
FIG. 12 is a diagram for explaining an example of communication between a controller and a motor driving control device in the present variant.

FIG. 12 is a diagram for explaining an example of communication between the controller 102 and the motor driving control device 150 in the present variant.

As illustrated in FIG. 12, in the present variant, the communication between the controller 102 and the motor driving control device 150 is different from the communication between the controller 2 and the motor driving control device 50 in the above-described embodiment only in a process related to the setting reference information (step S112), and the other processes (step S112 to step S117) are identical to those in the above-described embodiment. That is, in the present variant, the number information (maximum connection number) is transmitted as the setting reference information, but the information related to the rated voltage is not transmitted.

Figure 13:
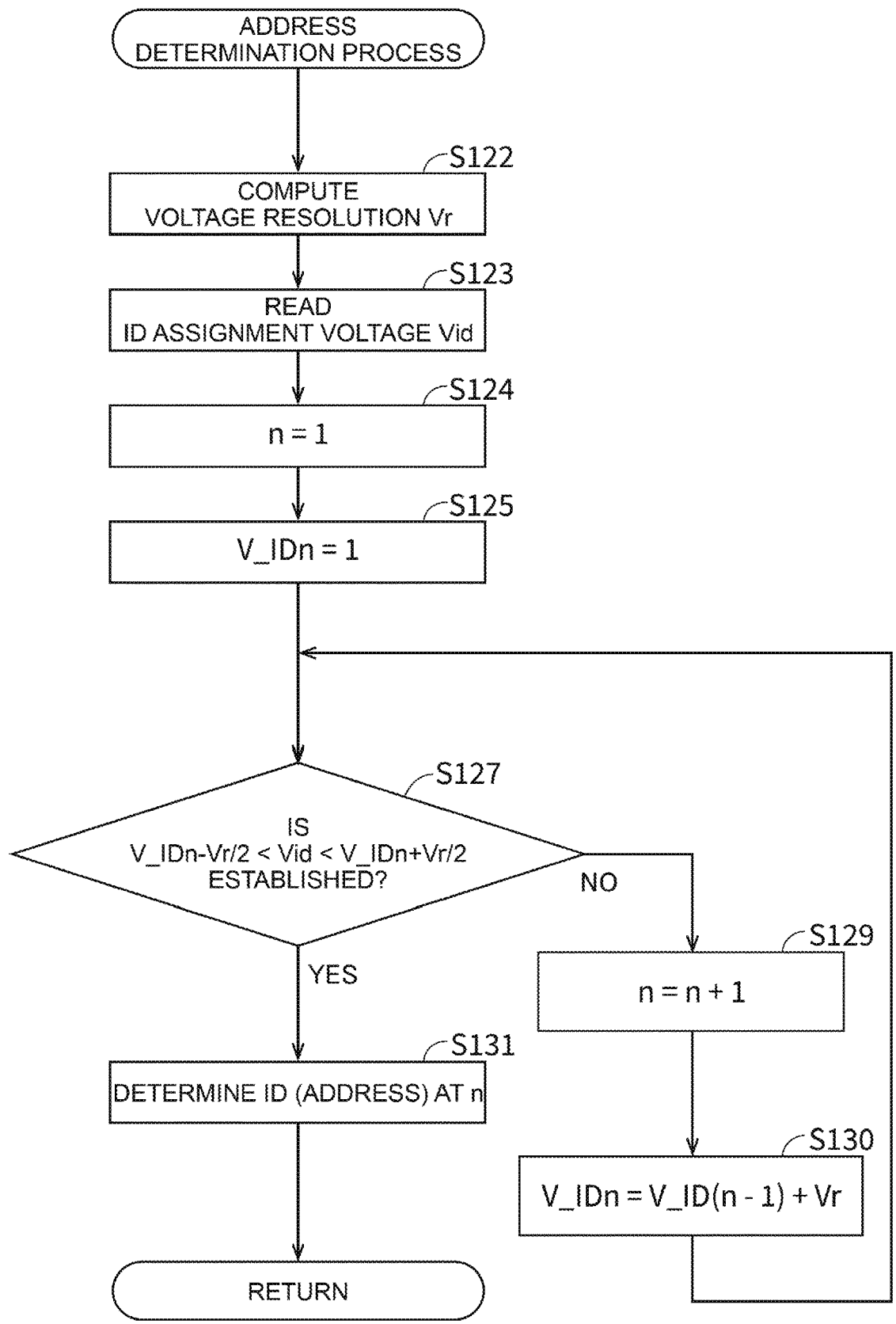
FIG. 13 is a flowchart illustrating an address determination process in the present variant.

FIG. 13 is a flowchart illustrating the address determination process in the present variant.

In the present variant, the setting voltage Vid is stably input from the controller 102. Thus, the processes for considering the variation of the power supply voltage Vcc (i.e., step S21 and step S26 in FIG. 4) performed in the above-described embodiment are omitted, the other steps S122 to S125, and S127 to S131 are performed in the same manner as steps S22 to S25, and S27 to S31 in FIG. 4. Note that since a correction process related to the voltage range is not performed, in step S127, the ID determination unit 32 determines whether the setting voltage Vid falls within the voltage range determined using the reference voltage V_IDn and the voltage resolution Vr as it is.

In the present variant, since the setting voltage Vid is stably input from the controller 102, it is not necessary to consider the power supply voltage Vcc. Accordingly, it is not necessary to monitor the power supply voltage Vcc. Therefore, the circuit of the control circuit 13 can be simplified, the calculation amount in the address determination process can be reduced, and the identification information can be appropriately set. The change of the specification of the power supply voltage Vcc will not affect the setting of the identification information.

In addition, in the present variant, the effect of facilitating the construction and maintenance of the motor driving system 105 can be obtained similarly to the above-described embodiment.

[Others]

The circuit configuration of the motor driving system is not limited to the specific examples described in the embodiment and variant described above. The individual components in the embodiment and variant described above may be appropriately combined and configured to fit for the purpose of the disclosure. In addition, various circuit configurations configured to be suitable for the object of the disclosure may be applied.

The configuration of the control circuit is not limited to the above-described configuration. In the control circuit, various circuit configurations functioning as the first acquisition unit, the setting unit, and the second acquisition unit may be applied.

The various voltage values described above are illustrative only and not intended to be limiting.

The motor driven by the motor driving control device of the present embodiment is not limited to a three-phase brushless motor. The motor may be another kind of motor. The number of phases of the motor is not limited to three.

The motor driving system is not limited to a motor driving system using a plurality of fan motors, and may be used in other applications of controlling a plurality of motors.

The communication between the controller and each of the motor driving control devices may be unidirectional or bidirectional communication. In the case of bidirectional communication, the communication is not limited to one-line communication. For example, a terminal for communication may be newly provided in addition to the communication terminal to perform two-line communication using a line for each of transmission and reception.

The setting of voltage ranges is not limited to the above-described examples. For example, if the setting voltage Vid is 0 volts or high voltage or equivalent (e.g., 5 volts), the previously set identification information may be continuously set without performing the setting operation of the identification information. In this way, even when the abnormality has occurred in the power supply voltage Vcc and a voltage dividing circuit, the identification information can be prevented from being changed, and the coherence between identification information for each of the plurality of fan motors before the abnormality has occurred and identification information for each of the plurality of fan motors after the abnormality has occurred can be maintained.

In the present embodiment, the setting reference information has been described as being transmitted from the controller, but the embodiment of the present disclosure is not limited thereto, and may be transmitted from a device other than the controller.

In the present embodiment, an example where all of the plurality of motors to be connected have different identification information has been described, but it is not necessary to set different identification information for all of the motors to be connected, and the same identification information may be set for each of the groups or part of a motor group in order to receive the same instruction information. In this case, the controller transmits the same set voltage information to each of the groups or part of a motor group, and the individual identification information can be set by distinguishing the setting reference information (for example, the connection number is counted as "1" for the same group).

The above-described flowcharts each represent an example for describing an operation, and are not limited thereto. The steps illustrated in each figure of the flowchart are specific examples, and are not limited to this flow. For example, the order of each step may be changed, or another process may be inserted between the steps. The processes may be performed in parallel.

Some of all of the processes in the above-described embodiment may be performed by software, and be performed using a hardware circuit. For example, the control circuit is not limited to the microcomputer. The internal configuration of the control circuit may be configured such that at least a part of the control circuit is processed by software.

It is also possible to provide a program for performing the above-described processes according to the embodiment, and the corresponding program may be recorded in recording media (non-transitory computer readable medium) such as a CD-ROM, a flexible disk, a hard disk, a ROM, a RAM, and a memory card to provide to users. The corresponding program may be downloaded to an apparatus through a communication line such as the Internet. The processes described in sentences in the above-described flowcharts may be performed according to the corresponding program by the CPU or the like.

It should be understood that the illustrative embodiment disclosed herein is illustrative and non-restrictive in every respect. The scope of the present disclosure is defined by the terms of the claims, rather than the description above, and is intended to include any modifications within the scope and meaning equivalent to the terms of the claims.

What is claimed is:

1. A motor driving control device, together with a controller, included in a motor driving system, comprising:
    a control circuit controlling the driving of a motor according to instruction information transmitted from the controller, wherein
    the control circuit includes:
        a first acquisition unit acquiring setting reference information related to assignment of identification information for the motor driving control device itself, the setting reference information being input from outside;
        an identification (ID) determination unit that determines and sets the motor driving control device's identification information based on a magnitude of a setting voltage input from the outside and the setting reference information; and
        a second acquisition unit acquiring the instruction information based on the motor driving control device's identification information set by the ID determination unit.

2. The motor driving control device according to claim 1, wherein
    the instruction information includes information related to the drive of the motor, and designation information designating the motor driving control device that will be caused to execute a control operation based on the information related to the drive of the motor, and
    the control circuit controls the drive of the motor according to the instruction information when the designation information corresponding to the identification information set by the ID determination unit is included in the instruction information.

3. The motor driving control device according to claim 2, wherein
    the control circuit does not execute the control operation of the drive of the motor according to the instruction information when the designation information corresponding to the identification information set by the ID determination unit is not included in the instruction information.

4. The motor driving control device according to claim 2, wherein
    the control circuit outputs response information to the controller when the designation information corresponding to the identification information set by the ID determination unit is included in the instruction information.

5. The motor driving control device according to claim 1, wherein
    the ID determination unit sets, as the motor driving control device's identification information, information corresponding to a voltage range including a setting voltage out of a plurality of voltage ranges determined based on the setting reference information.

6. The motor driving control device according to claim 1, wherein
the setting reference information includes number information indicating the number of motor driving control devices usable in the motor driving system.

7. The motor driving control device according to claim 6, wherein
the setting reference information includes information related to a rated voltage of the motor driving system.

8. A motor driving system, comprising:
a first motor driving control device controlling drive of a first motor;
a second motor driving control device controlling drive of a second motor;
a controller connected to the first motor driving control device and the second motor driving control device;
a first voltage output unit outputting a first setting voltage to the first motor driving control device; and
a second voltage output unit outputting a second setting voltage to the second motor driving control device, the second setting voltage being different in magnitude from the first setting voltage, wherein
the first motor driving control device and the second motor driving control device are included in a motor driving system together with a controller, wherein
the first motor driving control device and the second motor driving control device respectively include:
a control circuit controlling drive of a motor according to instruction information transmitted from the controller, wherein
the control circuit includes:
a first acquisition unit acquiring setting reference information related to assignment of identification information for the motor driving control device itself, the setting reference information being input from outside;
a setting unit setting the motor driving control device's identification information based on a magnitude of a setting voltage input from the outside and the setting reference information; and
a second acquisition unit acquiring the instruction information based on the identification information set by the setting unit, wherein
the controller outputs instruction information to the first motor driving control device and the second motor driving control device, and outputs setting reference information to the first motor driving control device and the second motor driving control device.

9. The motor driving system according to claim 8, wherein
the first voltage output unit and the second voltage output unit are voltage dividing circuits dividing a voltage of a predetermined voltage source at respective voltage dividing ratios different from each other.

10. The motor driving system according to claim 9, wherein
the voltage of the predetermined voltage source is a power supply voltage supplied to the first motor driving control device and the second motor driving control device, and
each of the first setting voltage and the second setting voltage is a constant voltage.

11. The motor driving system according to claim 8, wherein
the first voltage output unit and the second voltage output unit are provided in the controller.

12. A non-transitory computer readable medium that stores therein a control program of a motor driving control device, wherein
the motor driving control device together with a controller, included in a motor driving system, wherein
the motor driving control device controlling drive of a motor according to instruction information corresponding to the motor driving control device itself, the instruction information being transmitted from the controller, wherein
the control program causes a computer to execute:
a first acquisition step of acquiring setting reference information related to assignment of identification information for the motor driving control device itself, the setting reference information being input from outside;
an identification (ID) determination step of determining and setting the motor driving control device's identification information based on a magnitude of a setting voltage input from the outside and the setting reference information; and
a second acquisition step of acquiring the instruction information based on the motor driving control device's identification information set by the ID determination step.

\* \* \* \* \*